United States Patent
Uehara et al.

(10) Patent No.: US 6,733,899 B2
(45) Date of Patent: May 11, 2004

(54) METAL PLATE AND METHOD OF SHAPING THE SAME

(75) Inventors: Sumio Uehara, Nagano (JP); Yoshihisa Nagamine, Nagano (JP); Toshifumi Iizuka, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/366,608

(22) Filed: Feb. 14, 2003

(65) Prior Publication Data
US 2003/0157359 A1 Aug. 21, 2003

(30) Foreign Application Priority Data
Feb. 19, 2002 (JP) .......................... 2002-041515

(51) Int. Cl.⁷ .......................... B21D 28/02; B32B 15/00
(52) U.S. Cl. .................. 428/573; 428/596; 428/601; 72/332; 72/324; 72/340; 72/379.2
(58) Field of Search .................. 428/573, 596, 428/601, 571, 620; 72/332, 324, 340, 379.2

(56) References Cited

U.S. PATENT DOCUMENTS

| | | | | |
|---|---|---|---|---|
| 5,844,779 A | * | 12/1998 | Choi | 361/723 |
| 6,066,512 A | * | 5/2000 | Hashimoto | 438/112 |
| 6,145,365 A | * | 11/2000 | Miyahara | 72/332 |
| 6,409,859 B1 | * | 6/2002 | Chung | 156/69 |
| 6,442,990 B1 | * | 9/2002 | Komatsu et al. | 72/334 |
| 6,571,595 B2 | * | 6/2003 | Miyahara | 72/332 |

* cited by examiner

Primary Examiner—John J. Zimmerman
Assistant Examiner—Jason L Savage
(74) Attorney, Agent, or Firm—Armstrong, Kratz, Quintos, Hanson & Brooks, LLP

(57) ABSTRACT

There are provided a step of forming a structure in which a first concave portion is formed in a predetermined portion on one surface of a metal plate and also a convex portion that protrudes from other surface of the metal plate is formed by formation of the first concave portion and a second concave portion is formed in a predetermined portion on an outside of a peripheral portion of the convex portion, by shaping the metal plate by means of stamping using a die, and a step of cutting the convex portion formed on the other surface of the metal plate.

8 Claims, 7 Drawing Sheets

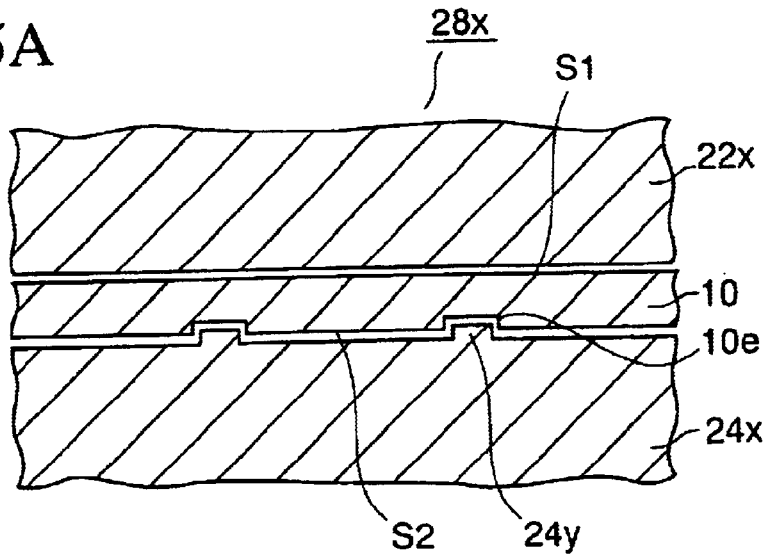
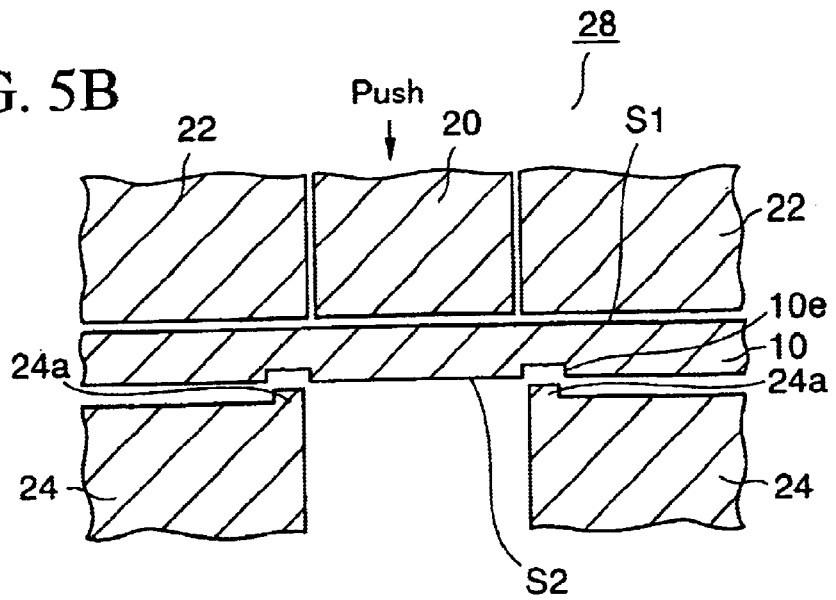

METAL PLATE AND METHOD OF SHAPING THE SAME

BACKGROUND OF THE INVENTION

1) Field of the Invention

The present invention relates to a metal plate and a method of shaping the same and, more particularly, a metal plate that is called a stiffener (a radiating plate and reinforcing plate) employed in a semiconductor device, in which semiconductor chips are packaged in its package, and a method of shaping the same.

2) Description of the Related Art

In recent years, development of the LSI technology as a key technology applied to implement multimedia devices is proceeding steadily toward the higher-speed and larger capacity data transmission. With this development, the higher-density packaging technology of the interface between the LSI and the electronic device is in progress.

As the package that is adapted for the high-density packaging, various packages have been developed. For example, there is the BGA (Ball Grid Array) package in which solder ball terminals are provided to the surface of the package like a grid array in place of lead terminals. Also, there is the TBGA (Tape Ball Grid Array) package that aims at the high performance and multiple pin by using a polyimide tape as the package base material. In some of the TBGA packages, the radiating plate and reinforcing plate, which is called the stiffener, is provided to the back side of the semiconductor chip.

FIG. 1 is a sectional view showing an example of the TBGA package having the stiffener. As shown in FIG. 1, in a TBGA package 116 of this package, a concave portion 100a is provided in the center portion of one surface of a stiffener 100 made of the metal plate and then a semiconductor chip 108 is fixed to a bottom portion of this concave portion 100a via an adhesive layer 110b. A polyimide film 102 having Cu wirings 104 thereon is adhered to one surface of the stiffener 100 except the concave portion 100a via an adhesive layer 110a. A solder resist film 105 having opening portions in its predetermined portions is formed on the Cu wirings 104, and then solder bumps 106 are connected to the Cu wirings 104 via the opening portions respectively. Then, electrode pads of the semiconductor chip 108 and bonding pads of the Cu wirings 104 are connected mutually via wires 112. Also, the semiconductor chip 108, the bonding pads of the Cu wirings 104, and the wires 112 are sealed with a molding resin 114.

Further, in case a radiation effect of the package must be enhanced, a plate-fin type heat sink, for example, is adhered/arranged onto an opposite surface to the surface of the stiffener 100, on which the semiconductor chip 108 is arranged. For this reason, it is preferable that the surface of the stiffener 100, on which the semiconductor chip 108 is not arranged, should be kept in the flat state.

FIGS. 2A to 2C are sectional views showing a stiffener shaping method in the prior art. FIGS. 3A and 3B are sectional views showing problems in the stiffener shaping method in the prior art. The stiffener shaping method in the prior art is set forth in Patent Application Publication (KOKAI) Hei 11-102998, for example. More particularly, as shown in FIG. 2A, first a die 128 having a metal punch 120, a clamping metal member 122, and a supporting table 124 is prepared, and then a metal plate 100x serving as the stiffener is positioned between the clamping metal member 122 and the supporting table 124.

Then, as shown in FIG. 2B, the predetermined concave portion 100a is formed by moving the metal punch 120 to push it against the metal plate 100x. At this time, a convex portion 100b that protrudes from the other surface of the metal plate 100x is formed simultaneously with the formation of the concave portion 100a.

Then, as shown in FIG. 2C, the convex portion 100b is cut by sliding a cutting edge 126 laterally from a connected portion A at which a base portion of the metal plate 100x and the convex portion 100b are jointed.

In the prior art, the stiffener is formed by shaping the metal plate 100x by means of the shaping method described above.

However, in the metal plate shaping method in the prior art, vertical variation in position of the cutting edge 126 is caused during the cutting. Thus, in the case that the cutting edge 126 is deviated upwardly during the cutting, the cutting edge 126 is stuck in the base portion of the metal plate 100x, as shown in FIG. 3A, when the cutting of the convex portion 100b by the cutting edge 126 is completed. Therefore, a cut chip 101a is still left in the state that such chip is connected to the metal plate 100x.

As the countermeasure to this, there is such a method that a cutting start position of the cutting edge 126 is set such that it is previously shifted downwardly and then the convex portion 100b is cut. However, in the case of this method, as shown in FIG. 3B, the cutting of the convex portion 100b by the cutting edge 126 is completed at a side surface portion of the convex portion 100b, which is positioned lower than the position of the connected portion A at which the base portion of the metal plate 100x and the convex portion 100b are jointed. Therefore, a step 101b is still left after the convex portion 100b is cut.

That is, so-called global step is still left on the cutting surface side of the metal plate 100x. Therefore, if the above plate-fin type heat sink is adhered/fixed onto the cutting surface, there is such a possible that disadvantages are caused.

As described above, since a height of the cutting edge 126 is varied vertically during the cutting, it is difficult in the extreme to cut the convex portion 100b such that the cut chip 101a or the step 101b is not left.

SUMMARY OF THE INVENTION

It is an object of the present invention to provide a metal plate shaping method capable of shaping a metal plate by forming a concave portion on one surface of the metal plate and then cutting a convex portion that is formed on the other surface by above formation to project therefrom in such a manner that a chip being connected to the metal plate is not left and also the other surface of the metal plate is formed in the substantially flat state, and the metal plate.

The present invention provides a metal plate shaping method which comprises the steps of forming a structure in which a first concave portion is formed in a predetermined portion on one surface of a metal plate, and also a convex portion that protrudes from other surface of the metal plate is formed by formation of the first concave portion, and a second concave portion is formed in a predetermined portion on an outside of a peripheral portion of the convex portion, by shaping a metal plate by means of stamping using a die; and cutting convex portion formed on the other surface of the metal plate.

In the present invention, as shown in FIGS. 4A and 4B, FIGS. 5A and 5B, and FIGS. 6A to 6C, first a first concave portion 10a is formed in a predetermined portion on one surface S1 of a metal plate 10 by stamping using a die, and also a convex portion 10b that protrudes from the other surface S2 is formed by the formation of the first concave portion 10a. At this time, simultaneously a second concave portion 10c is formed in a predetermined portion of the other surface S2 of the metal plate 10 on the outside of the peripheral portion of the convex portion 10b.

Otherwise, a fine concave portion 10e that corresponds to the second concave portion 10c may be formed previously on the other surface S2 of the metal plate 10. Then, the first concave portion 10a may be formed on one surface S1 of the metal plate 10, and the convex portion 10b that protrudes from the other surface S2 may be formed.

Then, the convex portion 10b formed on the other surface S2 of the metal plate 10 is cut by a cutting means 26. At this time, preferably a cutting operation is started from a portion, which is at the same height as the other surface S2, of a side surface portion B of the convex portion 10b by the cutting means 26. Then, the cutting means 26 breaks through a side surface portion C on the opposite side, and thus the convex portion 10b is cut off and separated from the metal plate 10.

In this manner, even if the vertical variation of the cutting means 26 is caused during the cutting operation of the convex portion 10b, the cutting means 26 can break through the side surface portion C of the convex portion 10b to finish the cutting operation since a depth D of the second concave portion 10c is set larger than a vertical variation dimension of the cutting means 26.

As a result, such a disadvantage is not caused that the cut chip 11 is connected to the metal plate 10 and is still left, and a cut chip 11 can be cut off and separated perfectly from the metal plate 10. In addition, a cut surface S3 of the convex portion 10b is almost equal in height to the other surface S2 of the metal plate 10 and thus a substantially flat surface can be obtained. Therefore, even if a heat sink is further provided to the other surface S2, there is no possibility that any trouble is caused.

In the above metal plate shaping method, preferably the die 28 includes a clamping metal member 22 having a cavity portion in its center portion, a metal punch 20 arranged in the cavity portion of the clamping metal member 22 movably in the vertical direction, and a supporting table 24 arranged below the clamping metal member 22, the supporting table 24 having a cavity portion in a portion that corresponds to the metal punch 20 and a projected portion 24a in a predetermined portion that corresponds to an outside of a peripheral portion of the metal punch 20.

If such die 28 is employed, such a structure can be easily shaped that the first concave portion 10a is formed in the predetermined portion on one surface S1 of the above metal plate 10 and also the convex portion 10b that protrudes from other surface S2 by formation of the first concave portion 10a is formed and the second concave portion 10c is formed on the outside of the peripheral portion of the convex portion 10b. After this, the convex portion 10b of the metal plate 10 may be cut by the above method. In this manner, the above metal plate shaping method can be easily implemented by employing the above die.

In this case, above drawing numbers and reference symbols are quoted so as to make the understanding of the invention easy. Therefore, they should not be interpreted to limit the present invention.

BRIEF DESCRIPTION OF THE DRAWINGS

FIGS. 5A and 5B are sectional views (variation of #1) showing a metal plate shaping method according to the embodiment of the present invention;

DESCRIPTION OF THE PREFERRED EMBODIMENT

An embodiment of the present invention will be explained with reference to the drawings hereinafter.

Figure 1:
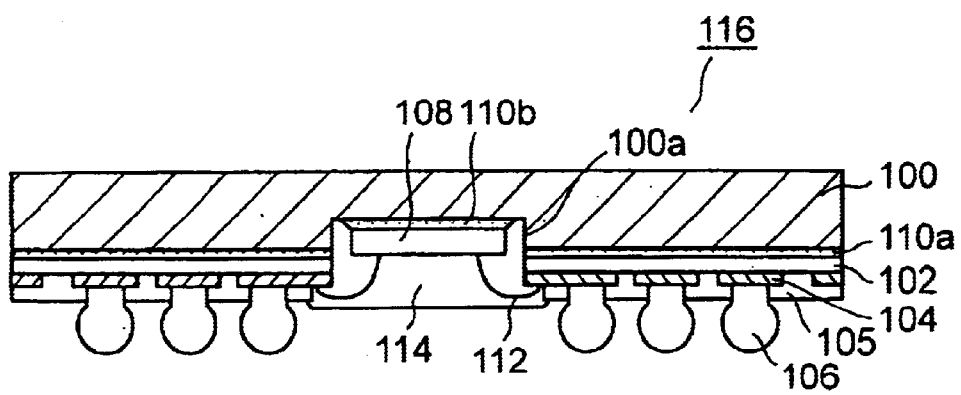
FIG. 1 is a sectional view showing an example of a TBGA package having a stiffener.
Figure 2A:
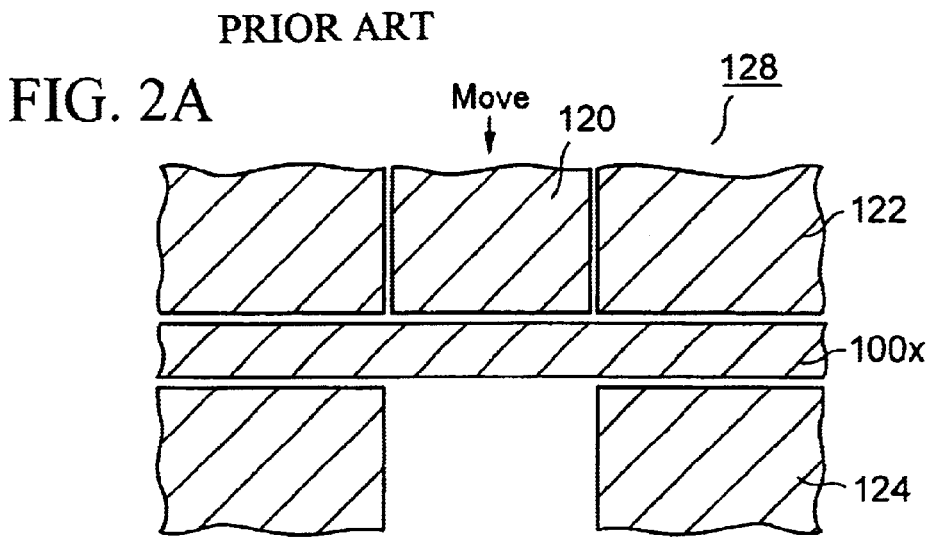
FIGS. 2A to 2C are sectional views showing a stiffener shaping method in the prior art.
Figure 2B:
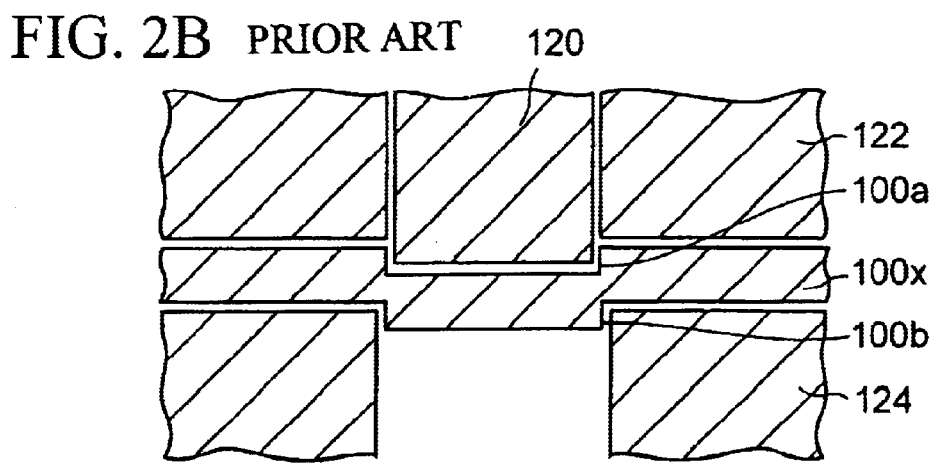
Figure 2C:
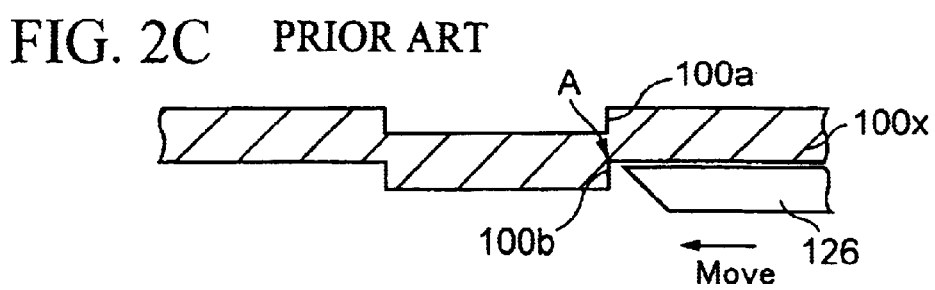
Figure 3A:
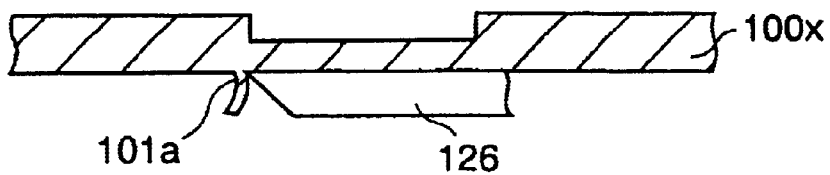
FIGS. 3A and 3B are sectional views showing problems in the stiffener shaping method in the prior art.
Figure 3B:
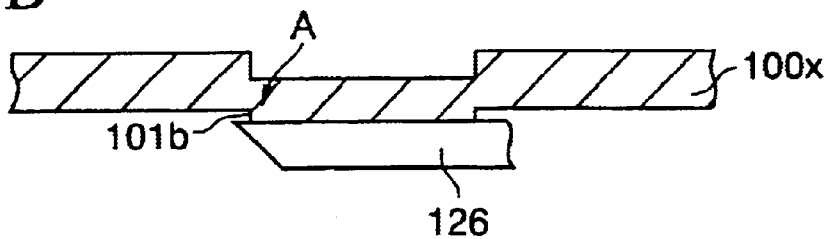
Figure 4A:
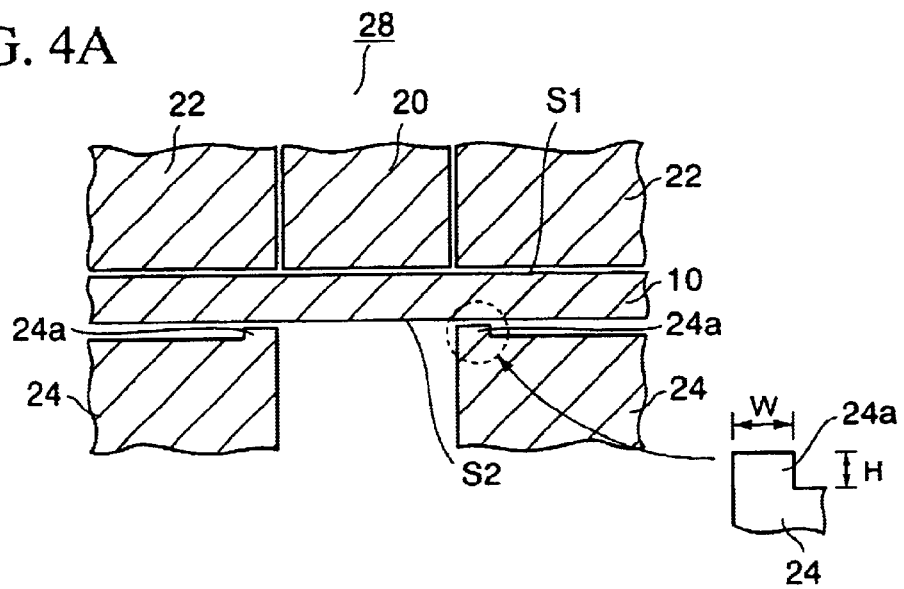
FIGS. 4A and 4B are sectional views (#1) showing a metal plate shaping method according to an embodiment of the present invention.

FIGS. 4A and 4B, FIGS. 5A and 5B, and FIGS. 6A to 6C are sectional views showing a metal plate shaping method according to an embodiment of the present invention. In the metal plate shaping method according to the embodiment of the present invention, first a die 28 shown in FIG. 4A is prepared. This die 28 consists basically of a clamping metal member 22, a metal punch 20, and a supporting table 24. The clamping metal member 22 has a cavity portion in its center portion, and the metal punch 20 that can be moved vertically is arranged in the cavity portion. The supporting table 24 having a cavity portion at a position, which responds to the metal punch 20, is arranged under the clamping metal member 22. A projected portion 24a is provided to a position, which corresponds to the outside of an outer peripheral portion of the metal punch 20, of the supporting table 24.

These members constituting the die 28 are formed of the cemented carbide that is manufactured by sintering metal powders, e.g., tungsten carbide (WC), or the like. This die 28 can press a workpiece into a predetermined shape or punch a predetermined shape in the workpiece by moving the metal punch 20 to the workpiece side and then pushing the metal punch 20 against the workpiece in the situation that the workpiece is clamped by the supporting table 24 and the clamping metal member 22.

Since the above projected portion 24a is provided to the supporting table 24 of this die 28, not only is a first concave portion formed on one surface of the workpiece by the metal punch 20 and simultaneously a convex portion is formed on the other surface, but also a second concave portion is formed in a portion, which coincides with the projected portion 24a of the supporting table 24, on the other surface of the workpiece. The projected portion 24a that is formed on the peripheral portion of the supporting table 24 may have a height H of 2 μm to 30 μm, preferably about 10 μm, and a width W of 0.3 mm to 2 mm, preferably about 1 mm, for example.

A metal plate 10 whose thickness is about 0.8 mm, for example, is arranged between the clamping metal member 22 and the supporting table 24 of the die 28 that has the above structure. This metal plate 10 is formed of copper alloy, stainless steel, aluminum, or the like, and serves as the stiffener (the radiating plate and reinforcing plate) when such plate is subjected to the stamping by using the above die 28, or the like.

Figure 4B:
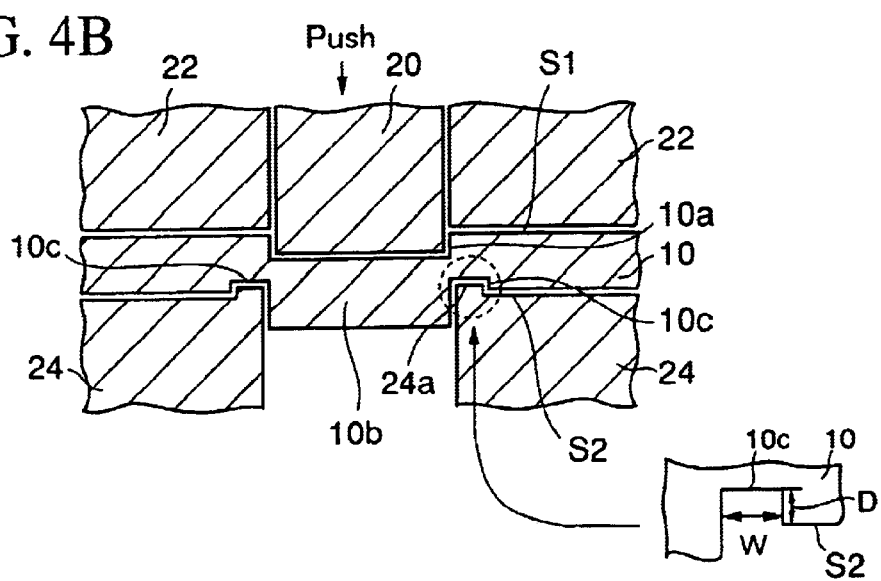

Then, as shown in FIG. 4B, if the metal plate 10 is pushed by the metal punch 20 in the situation that the metal plate 10 is put and clamped between the clamping metal member 22 and the supporting table 24, a first concave portion 10a having an almost quadrangular shape and a depth of 0.4 mm, for example, is formed on one surface S1 of the metal plate 10 and also a convex portion 10b is formed because a part of the metal plate 10 is pushed by the formation of this first concave portion 10a to protrude from the other surface S2. At this time, because a portion that corresponds to the projected portion 24a provided to the supporting table 24 is pushed on the other surface S2 of the metal plate 10 to cause the plastic deformation, a second concave portion 10c is formed simultaneously in a predetermined portion on the outside of the peripheral portion of the convex portion 10b.

Since the semiconductor chip is fixed to a bottom portion of the first concave portion 10a, shape, dimensions, depth, etc. of the first concave portion 10a may be adjusted appropriately to meet to chip sizes and thicknesses of various semiconductor chips. Also, since the second concave portion 10c is formed to meet to the projected portion 24a of the supporting table 24, its depth D is set to 2 $\mu$m to 30 $\mu$m from the other surface S2 of the metal plate 10 (the surface other than the convex portion 10b), preferably about 10 $\mu$m, and its width W is set to 0.3 mm to 2 mm, preferably about 1 mm.

The second concave portion 10c formed on the other surface S2 of the metal plate 10 is provided not to leave the cut chip or the global step on the other surface S2 of the metal plate 10 when the convex portion 10b of the metal plate 10 is cut in later steps.

Then, a variation of the method of shaping the metal plate 10 into the shape shown in FIG. 4B will be explained hereunder. In the above example, the method of forming the first concave portion 10a, the convex portion 10b, and the second concave portion 10c in the metal plate 10 at the same time is exemplified. In this case, as shown in FIGS. 5A and 5B, first a fine concave portion 10e that corresponds to the second concave portion 10c may be formed, and then the first concave portion 10a and the convex portion 10b may be formed.

Then, explanation will be made in more detail. As shown in FIG. 5A, first a first die 28x that consists basically of a clamping metal member 22x and a supporting table 24x is prepared. A projected portion 24y used to form the above fine concave portion 10e, which corresponds to the second concave portion 10c in the metal plate 10, is provided to this supporting table 24x.

Then, the metal plate 10 is arranged between the clamping metal, member 22x and the supporting table 24x of the first die 28x, and then the stamping is applied to this metal plate 10. Thus, the ring-like fine concave portion 10e that corresponds to the second concave portion 10c is formed in a predetermined portion of the other surface S2 of the metal plate 10.

Then, as shown in FIG. 5B, a die (second die) 28 that is similar to that shown in FIG. 4A is prepared. Then, the metal plate 10 is arranged in the die 28 such that the other surface S2 of the metal plate 10 is directed to the supporting table 24 side and also the projected portion 24a of the supporting table 24 is fitted into the fine concave portion 10e, and then the stamping is applied to this metal plate 10.

Accordingly, in the situation that the projected portion 24a of the supporting table 24 is fitted into the fine concave portion 10e of the metal plate 10, the first concave portion 10a is formed in the predetermined portion of one surface S1 of the metal plate 10 and also the convex portion 10b that protrudes from the other surface S2 of the metal plate 10 is formed by the formation of the first concave portion 10a. In this manner, a structure that is similar to the metal plate 10 shown in FIG. 4B may be formed.

Figure 6A:
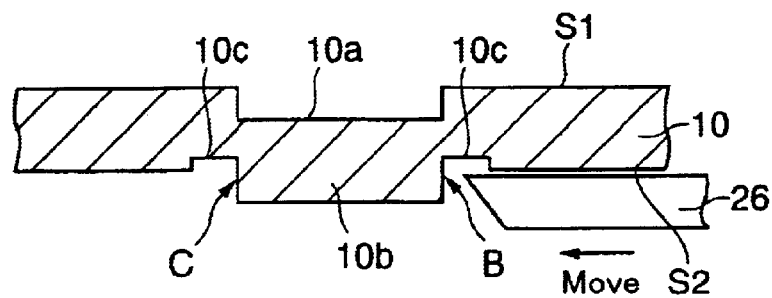
FIGS. 6A to 6C are sectional views (#2) showing a metal plate shaping method according to the embodiment of the present invention.

Next, the step of cutting the convex portion 10b formed on the other surface S2 of the metal plate 10 will be explained hereunder. First, a cutting means for cutting the convex portion 10b of the metal plate 10 is prepared. As shown in FIG. 6A, a cutting device (not shown) having a cutting edge 26 may be employed as the cutting means. Like the above constituent member of the die 28, this cutting edge 26 is made of the cemented carbide, or the like. Then, the position of the cutting edge 26 is set such that an upper surface of the cutting edge 26 is brought into contact with the other surface S2 of the metal plate 10, which has been subjected to the stamping, or is positioned closely to the other surface S2 not to come into contact with it. Then, the cutting edge 26 is slid towards the convex portion 10b side in parallel with the other surface S2 of the metal plate 10.

Figure 6B:
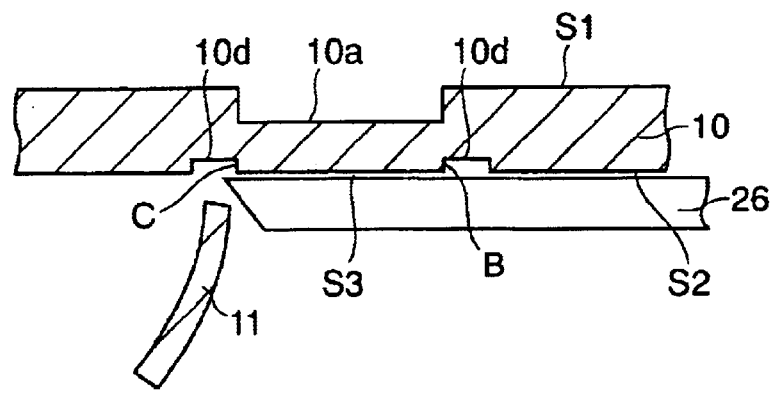

Accordingly, as shown in FIG. 6B, a top end portion of the cutting edge 26 sticks in a portion, which is at the same level as the other surface S2, of a side surface portion B of the convex portion 10b, and thus the cutting operation is started. Then, the cutting edge 26 breaks through a side surface portion C on the opposite side, and thus the convex portion 10b is cut off and separated from the metal plate 10.

In this manner, even if the vertical variation of the cutting edge 26 is caused during the cutting of the convex portion 10b, the cutting edge 26 can break through the side surface portion C of the convex portion 10b to finish the cutting operation since a depth D of the second concave portion 10c is set to about 10 $\mu$m preferably, which is larger than a vertical variation dimension (e.g., 2 to 3 $\mu$m) of the cutting edge 26. In other words, even if the cutting edge 26 is deviated upwardly from the position that is set at the time of starting the cutting operation, the top end portion of the cutting edge 26 never sticks in the base portion of the metal plate 10 when the cutting operation is finished.

As a result, a cut chip 11 can be cut off and separated perfectly from the metal plate 10 without such a disadvantage that the cut chip 11 is still connected to the metal plate 10 and is left after the cutting operation is finished. In addition, a cut surface S3 of the convex portion 10b is substantially equal in height to the other surface S2 of the metal plate 10.

According to the shaping method of the present embodiment, a groove 10 d in which a depth of the second concave portion 10c on the convex portion 10b side is reduced still remains on the other surface S2 of the metal plate 10 in which the cutting operation of the convex portion 10b has been finished. However, since this groove 10d resides locally as the fine indent on the peripheral portion of the area in which the convex portion 10b was formed, it is possible to say that the other surface S2 of the metal plate 10 can be shaped into the almost flat surface. As a result, in case the plate-fin type heat sink is further provided onto the other surface S2 of the metal plate 10, there is no possibility to cause any disadvantage unlike the prior art.

Figure 6C:
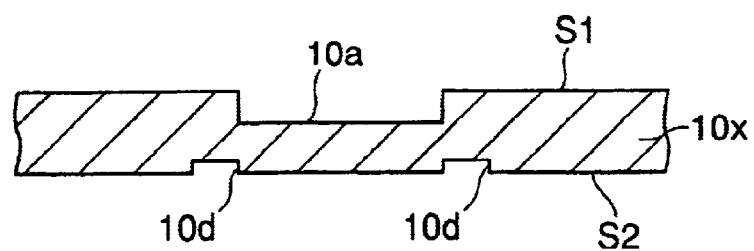

In this manner, as shown in FIG. 6C, a stiffener 10x in which the first concave portion 10a, to which the semiconductor chip is fixed, is formed on one surface S1 and the fine groove 10d is formed on the other surface S2 in vicinity of the peripheral portion of the first concave portion 10a or on the outside portion thereof is completed.

In this case, in the present embodiment, as shown in FIG. 4B, the "⊐"-shape is exemplified as the shape of the second concave portion 10c of the metal plate 10. But the U-shape in which a bottom portion of the second concave portion 10c has a projected shape or a semi-circle, etc. may be employed. That is, if the convex portion 10b can be cut such that the cutting edge 26 thrusts through the convex portion 10b from the side surface portion B to the side surface portion C, any shape may be selected as the shape of the second concave portion 10c.

Next, a semiconductor device in which the semiconductor chips are packaged in the TBGA package having the stiffener 10x that is shaped by the shaping method of the above present embodiment will be explained hereunder.

Figure 7:
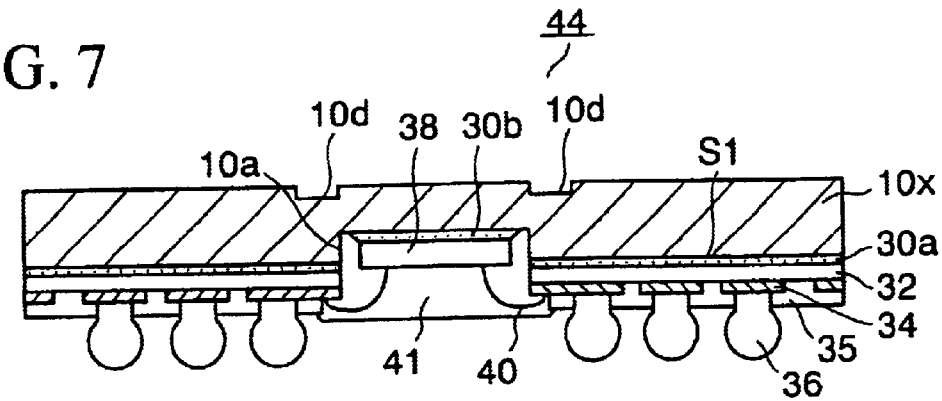
FIG. 7 is a sectional view showing a semiconductor device in which semiconductor chips are packaged in the TBGA package having a stiffener that is shaped by the shaping method of the embodiment.
Figure 8:
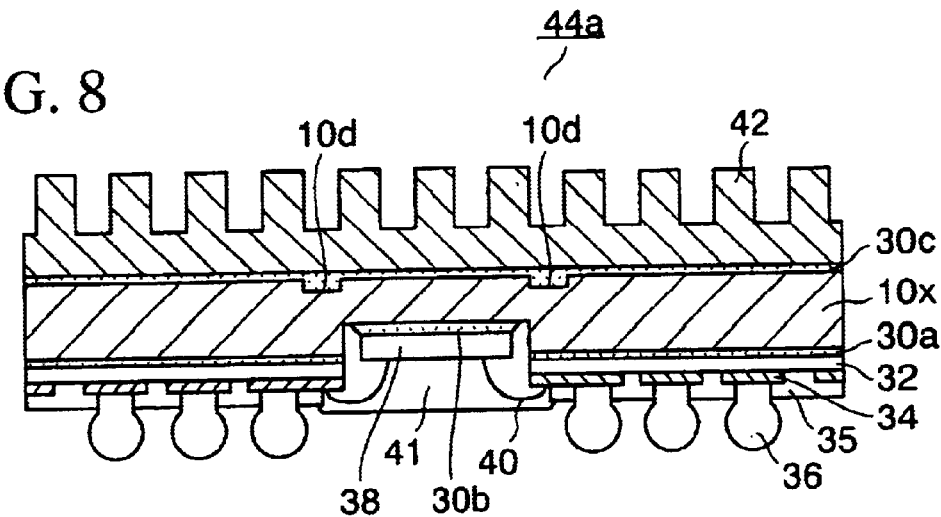
FIG. 8 is a sectional view showing a semiconductor device obtained by further providing a heat sink to the semiconductor device in FIG. 7.

FIG. 7 is a sectional view showing the semiconductor device in which the semiconductor chips are packaged in the TBGA package having the stiffener that is shaped by the shaping method of the embodiment. FIG. 8 is a sectional view showing a semiconductor device obtained by further providing a heat sink to the semiconductor device in FIG. 7.

As shown in FIG. 7, in a semiconductor device 44 according to the present embodiment, a polyimide film 32 having Cu wirings 34 thereon is adhered to one surface S1 of the stiffener 10x that is shaped by the above shaping method via an adhesive layer 30a. A solder resist film 35 is formed by the patterning such that solder ball mounting portions and bonding pads of the Cu wirings 34 are exposed. Solder balls 36 are mounted on the solder ball mounting portions respectively.

Also, a semiconductor chip 38 is fixed to a bottom portion of the first concave portion 10a of the stiffener 10x by an adhesive layer 30b. Electrode pads of the semiconductor chip 38 and the bonding pads of the Cu wirings 34 are connected via wires 40. In addition, the semiconductor chip 38, the bonding pads of the Cu wirings 34, and the wires 40 are sealed with a mold resin 41.

A semiconductor device 44a shown in FIG. 8 is constructed by adhering a plate-fin type heat sink 42 to the surface, on which the groove 10d is formed, of the stiffener 10x of the semiconductor device 44 shown in FIG. 7 via an adhesive layer 30c. Since remaining constituent elements are the same as the semiconductor device 44 in FIG. 7, their explanation will be omitted herein.

If the metal plate shaping method in the present embodiment is employed, the groove 10d is formed locally on the surface, onto which the heat sink 42 is fixed, of the stiffener 10x, but surface portions except the groove 10d can be formed flat in almost same level. Therefore, as described above, no trouble is caused when the heat sink 42 is fixed to the stiffener 10x via the adhesive layer 30c.

What is claimed is:

1. A metal plate shaping method comprising the steps of:

forming a structure in which a first concave portion is formed in a predetermined portion on one surface of a metal plate, and also a convex portion that protrudes from other surface of the metal plate is formed by formation of the first concave portion, and a second concave portion is formed in a predetermined portion on an outside of a peripheral portion of the convex portion on the other surface of the metal plate, by shaping the metal plate by means of stamping using a die; and cutting the convex portion formed on the other surface of the metal plate.

2. A metal plate shaping method according to claim 1, wherein, in the step of forming the structure by shaping the metal plate, the first concave portion, the convex portion, the second concave portion are formed simultaneously.

3. A metal plate shaping method according to claim 1, wherein the step of forming the structure by shaping the metal plate includes the steps of, forming the second concave portion in the other surface of the metal plate, the second concave portion having a ring-like shape and surrounding a predetermined portion, by stamping using a first die, and forming the first concave portion in a portion of the one surface of the metal plate corresponding to a predetermined portion which the second concave portion surrounds by stamping using a second die, and also forming the convex portion which protrudes from the other surface of the metal plate surrounded with the second concave portion by formation of the first concave portion.

4. A metal plate shaping method according to claim 1, wherein, in the step of cutting the convex portion, the convex portion is cut from a position, which corresponds to the other surface of the metal plate, of one side surface of the convex portion by a cutting means.

5. A metal plate shaping method according to claim 2, wherein the die includes a clamping metal member having a cavity portion in a center portion, a metal punch arranged in the cavity portion of the clamping metal member vertically movably, and a supporting table arranged below the clamping metal member, the supporting table having a cavity portion in a portion that corresponds to the metal punch and a projected portion in a predetermined portion that corresponds to an outside of a peripheral portion of the metal punch.

6. A metal plate shaping method according to claim 1, wherein the second concave portion is formed to have a depth of 2 to 30 μm from the other surface of the metal plate and a width of 0.3 to 2 mm.

7. A metal plate that is shaped by the metal plate shaping method set forth in claim 1.

8. A metal plate according to claim 7, wherein the metal plate comprises a concave portion in a predetermined portion on one surface of the metal plate and a groove in a portion that corresponds to a neighborhood or an outside portion of a peripheral portion of the concave portion on other surface of the metal plate.

* * * * *